United States Patent [19]
Yonekura et al.

[11] Patent Number: 5,564,099
[45] Date of Patent: Oct. 8, 1996

[54] RADIO SIGNAL RECEPTION WITH A PLL FREQUENCY CONTROLLED FOR AN IF SIGNAL DEPENDING ON COEXISTENCE OF A SPURIOUS SIGNAL WITH THE RADIO SIGNAL

[75] Inventors: Kunitoshi Yonekura; Masahiro Matai, both of Tokyo, Japan

[73] Assignee: NEC Corporation, Tokyo, Japan

[21] Appl. No.: 257,693

[22] Filed: Jun. 6, 1994

[30]    Foreign Application Priority Data

Jun. 8, 1993   [JP]   Japan .................................. 5-136306

[51] Int. Cl.$^6$ ...................................................... H04B 1/26
[52] U.S. Cl. ........................ 455/318; 455/260; 455/266; 455/296; 455/316; 375/327
[58] Field of Search .................................... 455/318, 254, 455/255, 256, 257, 258, 259, 260, 263, 264, 265, 266, 283, 296, 192.1, 192.2, 182.1, 182.2, 196.1, 343, 324, 75, 76, 316; 375/326, 327

[56]    References Cited

U.S. PATENT DOCUMENTS

| | | | |
|---|---|---|---|
| 4,521,918 | 6/1985 | Challen | 455/343 |
| 4,777,655 | 10/1988 | Numata et al. | 455/76 |
| 4,817,197 | 3/1989 | Shimizu et al. | 455/208 |
| 4,918,403 | 4/1990 | Martin | 331/1 A |
| 5,109,544 | 4/1992 | Mittel et al. | 455/182.2 |
| 5,204,972 | 4/1993 | Hashimoto | 455/207 |
| 5,263,197 | 11/1993 | Manjo et al. | 455/324 |
| 5,361,407 | 11/1994 | Sawada et al. | 455/209 |
| 5,402,446 | 3/1995 | Minami | 375/344 |

*Primary Examiner*—Andrew Faile
*Assistant Examiner*—Lee Nguyen
*Attorney, Agent, or Firm*—Young & Thompson

[57]    ABSTRACT

In a radio receiver a PLL oscillator generates a phase locked oscillation signal with a controllable frequency and a frequency multiplier multiplies the controllable frequency with a controllable factor into a local oscillation frequency to provide a local oscillation signal for mixing into an IF signal with a radio signal reaching the receiver, the IF signal is monitored to raise the controllable frequency and to reduce the controllable factor when a spurious signal coexists with the radio signal. This coexistence is detected by monitoring a level difference between the IF signal and an output signal of an IF filter. Preferably, the oscillator comprises in a PLL two VCO's for generating phase locked oscillation signals of higher and lower oscillation frequencies, such as 260 and 65 MHz, and a controllable prescaler supplied with high and low voltage signals when the VCO's are put in operation at the higher and the lower oscillation frequencies. Concurrently, the controllable factor is controlled to factors of unity and four.

20 Claims, 4 Drawing Sheets

RADIO SIGNAL RECEPTION WITH A PLL FREQUENCY CONTROLLED FOR AN IF SIGNAL DEPENDING ON COEXISTENCE OF A SPURIOUS SIGNAL WITH THE RADIO SIGNAL

BACKGROUND OF THE INVENTION

1. Field of the Invention

This invention relates to reception of a radio signal by using a local oscillation signal which is generated by a phase locked loop (PLL) oscillator with frequency multiplication into a local oscillation frequency and is used in producing an intermediate frequency (IF) signal. More particularly, this invention relates to a radio signal receiving method, to a radio receiver, and to a combination of a local oscillator and intermediate frequency filter circuitry used in a radio receiver for receiving a radio signal to produce an information signal carried by the radio signal.

2. Description of the Related Art

In the manner which will later be described in greater detail, such a radio receiver comprises a high frequency circuit for receiving a radio signal to produce a high frequency signal of a radio frequency, a local oscillator for generating a local oscillation signal of a local oscillation frequency, a mixer or frequency converter for mixing the high frequency signal and the local oscillation signal into an intermediate frequency signal of an intermediate frequency, and receiver circuitry for receiving the intermediate frequency signal to produce an information signal carried by the radio signal. The receiver circuitry comprises intermediate frequency filter circuitry for filtering the intermediate frequency signal into a filtered signal and a demodulator for demodulating the filtered signal into the information signal.

The local oscillator may comprise a phase locked oscillator for generating in a phase locked loop a phase locked oscillation signal of a generated frequency. Connected to the phase locked loop in the local oscillator, a frequency multiplier frequency shifts the phase locked oscillation signal into the local oscillation signal with the generated frequency shifted by a multiplication factor into the local oscillation frequency.

In the radio receiver of the type described, a carrier to noise (C/N) ratio depends on a noise component near the generated frequency. If a spurious signal or a spurious electromagnetic wave coexists with the radio signal, the carrier to noise ratio adversely influences a sensitivity of the radio receiver to a great extent. More specifically, the information signal becomes unclear due to noise when the carrier to noise ratio is small. The carrier to noise ratio depends, in turn, on the multiplication factor. It is known that the carrier to noise ratio is degraded in general by an amount proportional in decibels (dB) to an expression as follows:

$$20 \log n,$$

where n represents the multiplication factor.

It is therefore understood that the generated frequency should be as high as possible to reduce the multiplication factor. This, however, necessitates a high operation frequency of a prescaler included in the phase locked loop. When put in operation at a high frequency, the prescaler must be supplied with a high voltage. This results in an undesirable increase in power consumption of the radio receiver.

SUMMARY OF THE INVENTION

It is consequently an object of the present invention to provide a radio signal receiving method of receiving a radio signal in which method a local oscillation signal is generated by a local oscillator in a phase locked loop and which method is operable with a little power consumption.

It is another object of this invention to provide a radio signal receiving method which is of the type described and which has an excellent reception sensitivity even when a spurious signal coexists with the radio signal.

it is still another object of this invention to provide a radio signal receiving method which is of the type described and which keeps a carrier to noise ratio excellent even when the spurious signal coexists with the radio signal.

It is yet another object of this invention to provide a radio signal receiving method which is of the type described and which is preferred for use in a selectively called mobile radio receiver.

It is a different object of this invention to provide a radio receiver which makes use of the radio signal receiving method of the type described and which is preferred for use as a selectively called mobile radio receiver.

It is a further different object of this invention to provide a combination of a local oscillator and intermediate frequency filter circuitry for use in a radio receiver of the type described.

Other objects of this invention will become clear as the description proceeds.

In accordance with an aspect of this invention, there is provided a radio signal receiving method of receiving a radio signal, comprising the steps of: (a) generating a phase locked oscillation signal of a generated frequency, (b) frequency multiplying the phase locked oscillation signal into a local oscillation signal with the generated frequency multiplied into a local oscillation frequency with a multiplication factor, (c) mixing the radio signal and the local oscillation signal into an intermediate frequency signal, and (d) receiving the intermediate frequency signal to produce an information signal carried by the radio signal, wherein: (A) the generating step is a controllable generating step of generating the phase locked oscillation signal with a controllable frequency (B) the frequency multiplying step being a controllable frequency multiplying step of multiplying the controllable frequency into the local oscillation frequency with a controllable factor used as the multiplication factor; (C) the receiving step comprising the steps of: (Ca) detecting responsive to the intermediate frequency signal whether or not a spurious signal coexists with the radio signal; and (Cb) controlling the controllable generating step and the controllable frequency multiplying step to raise the controllable frequency and to reduce the controllable factor when coexistence of the spurious signal is detected.

In accordance with a different aspect of this invention, there is provided a radio receiver which is for receiving a radio signal and comprises: (a) phase locked oscillator means for generating a phase locked oscillation signal of a generated frequency, (b) frequency multiplier means for frequency multiplying the phase locked oscillation signal into a local oscillation signal with the generated frequency multiplied into a local oscillation frequency with a multiplication factor, (c) mixer means for mixing the radio signal and the local oscillation signal into an intermediate frequency signal, and (d) receiver means for receiving the intermediate frequency signal to produce an information signal carried by the radio signal, wherein: (A) the phase locked oscillator means is controllable phase locked oscillator means for generating the phase locked oscillation signal with a controllable frequency used as the generated frequency; (B) the frequency multiplier means being controllable frequency multiplier means for multiplying the controllable frequency into the local oscillation frequency with a controllable factor used as the multiplication factor; (C) the receiver means comprising: (Ca) detector means responsive to the intermediate frequency signal for detecting whether or not a spurious signal coexists with the radio signal; and (Cb) control means for controlling the controllable phase locked oscillator means and the controllable frequency multiplier means to raise the controllable frequency and to reduce the controllable factor when coexistence of the spurious signal is detected.

In accordance with a further different aspect of this invention, there is provided a combination of a local oscillator and intermediate frequency filter circuitry used in a radio receiver comprising: (a) phase locked oscillator means for generating a phase locked oscillation signal of a generated frequency, (b) frequency multiplier means for frequency multiplying the phase locked oscillation signal into a local oscillation signal with the generated frequency multiplied into a local oscillation frequency with a multiplication factor to be operable as the local oscillator in cooperation with the phase locked oscillator means, and (c) mixer means for producing an intermediate frequency signal of an intermediate frequency by mixing the local oscillation signal and a radio signal reaching the radio receiver, the intermediate frequency filter circuitry comprising (d) an intermediate frequency bandpass filter for filtering the intermediate frequency signal into a filtered signal and (e) demodulator means for demodulating the filtered signal into an information signal carried by the radio signal, wherein: (A) the phase locked oscillator means is controllable phase locked oscillator means for generating the phase locked oscillation signal with a controllable frequency used as the generated frequency; (B) the frequency multiplier means being controllable frequency multiplier means for multiplying the controllable frequency into the local oscillation frequency with a controllable factor used as the multiplication factor: (C) the intermediate frequency filter circuitry further comprising: (Ca) detector means for detecting a level difference between the intermediate frequency signal and the filtered signal to produce a level difference signal indicative of whether or not a spurious signal coexists with the radio signal; and (Cb) control means for controlling the controllable phase locked oscillator means and the controllable frequency multiplier means to raise the controllable frequency and to reduce the controllable factor when coexistence of the spurious signal is detected.

BRIEF DESCRIPTION OF THE DRAWINGS

FIG. 2A is connected to the left of FIG. 2B, show in blocks a radio receiver according to an embodiment of the instant invention.

DESCRIPTION OF THE PREFERRED EMBODIMENT

Figure 1:
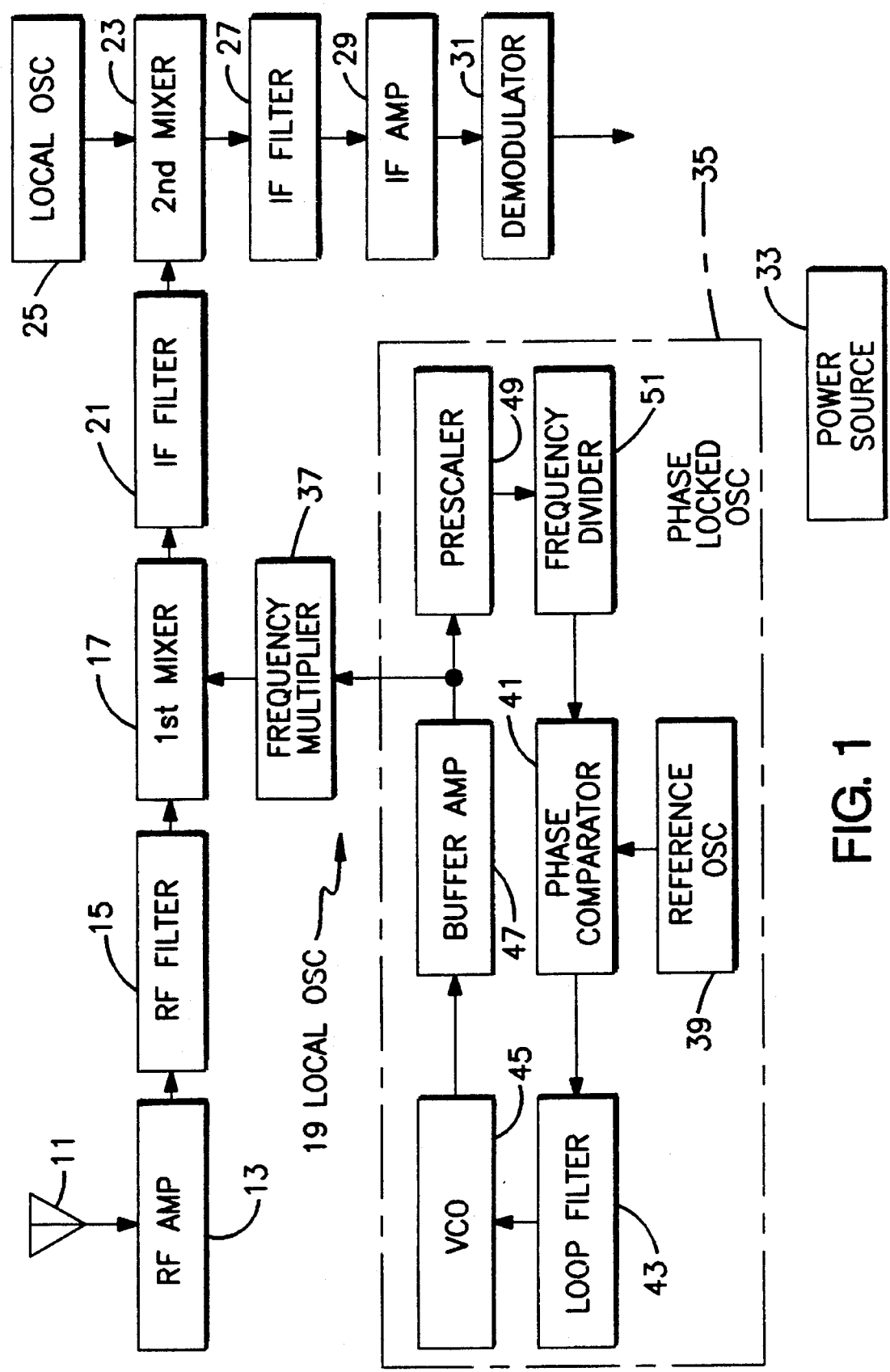
FIG. 1 is a block diagram of a conventional radio receiver.

Referring to FIG. 1, a conventional radio receiver will first be described in order to facilitate an understanding of the present invention. Such a radio receiver is for receiving a radio signal reaching an antenna 11.

From the antenna 11, the radio signal is supplied to a radio or high frequency (RF) amplifier 13 and is amplified into an amplified radio frequency signal of a radio frequency. A radio frequency bandpass filter 15 is for selecting a desired radio frequency band of the radio frequency to produce a radio frequency filter output signal.

From the radio frequency bandpass filter 15, the radio frequency filter output signal is delivered to a first mixer or frequency converter 17. A first local oscillator 19 generates a first local oscillation signal of a higher local oscillation frequency for supply to the first mixer 17 in the manner which will presently be described. Mixing the radio frequency filter output signal and the first local oscillation signal, the first mixer 17 produces a mixed signal as a first intermediate frequency (IF) signal of a first intermediate frequency. A first intermediate frequency bandpass filter 21 filters the mixed signal to produce a first intermediate frequency filter output signal of a first desired intermediate frequency band.

From the first intermediate frequency bandpass filter 21, the first intermediate frequency filter output signal is sent to a second mixer 23 to which a second local oscillation signal of a lower local oscillation frequency is sent from a second local oscillator 25. Mixing the first intermediate frequency filter output signal and the second local oscillation signal, the second mixer 23 produces a second intermediate frequency signal of a second intermediate frequency.

A second intermediate frequency bandpass filter 27 filters the second intermediate frequency signal to produce a second intermediate frequency filter output signal of a second desired intermediate frequency band. Like the first intermediate frequency signal which is simply called the mixed signal, the second intermediate frequency signal is herein referred to merely as an intermediate frequency signal. The second intermediate frequency filter output signal will be called a filtered signal.

Supplied from the second intermediate frequency bandpass filter 27, the filtered signal is sufficiently amplified by an intermediate frequency amplifier 29 into an intermediate frequency amplified signal. Connected to the intermediate frequency amplifier 29, a demodulator 31 demodulates the intermediate frequency amplified signal into an information signal carried by the radio signal for delivery to a utilization device, which is not depicted and may be a loudspeaker or the like. A power source 33 is for energizing various parts which are described in the foregoing and will be described in the following.

Referring more particularly to FIG. 1, the first local oscillator 19 comprises a phase locked oscillator 35 of a phase locked loop (PLL) synthesizer type for generating a phase locked oscillation signal of a generated frequency. In the first local oscillator 19, a frequency multiplier 37 frequency multiplies the phase locked oscillation signal into the first local oscillation signal by multiplying the generated frequency into the higher local oscillation frequency with a multiplication factor which may be equal at least to unity.

In the phase locked oscillator 35, a reference oscillator 39 generates a reference frequency signal of a reference frequency. Subjecting to phase comparison the reference frequency signal and a comparator input signal which will shortly be described, a phase comparator 41 produces a comparison result signal which represents a phase difference between the reference frequency signal and the comparator input signal and is used as a control voltage signal.

Through a loop filter 43, the control voltage signal controls a voltage controlled oscillator (VCO) 45, which generates a voltage controlled oscillation signal of a voltage controlled oscillation frequency. Suppressing influences undesiredly given to later stages, a buffer amplifier 47 amplifies the voltage controlled oscillation signal into an amplifier output signal for delivery to the frequency multiplier 37 as an output voltage controlled oscillation signal.

The output voltage controlled oscillation signal is furthermore delivered to a prescaler 49 for preliminarily frequency dividing the output voltage controlled oscillation signal into a prescaled signal. Connected to the prescaler 49 to be cooperative as a scaler, a frequency divider 51 frequency divides the prescaled signal into a frequency lowered signal which is of a frequency substantially equal to the reference frequency and is used as the comparator input signal. The output voltage controlled oscillation signal serves as the phase locked oscillation signal with the voltage controlled oscillation frequency used as the generated frequency.

In the manner described hereinabove, it is desirable to raise the generated frequency and to reduce the multiplication factor. The prescaler 49 must, however, be operable for this purpose at a high frequency with a high voltage supplied thereto from the power source 33. This results in a great current and in a great power consumption. A considerable part of power is consumed in the radio receiver at the prescaler 49. A high operation voltage of the prescaler 49 is therefore objectionable particularly when the radio receiver is a selectively called mobile radio receiver wherein a battery is used as the power source 33.

Figure 2A:
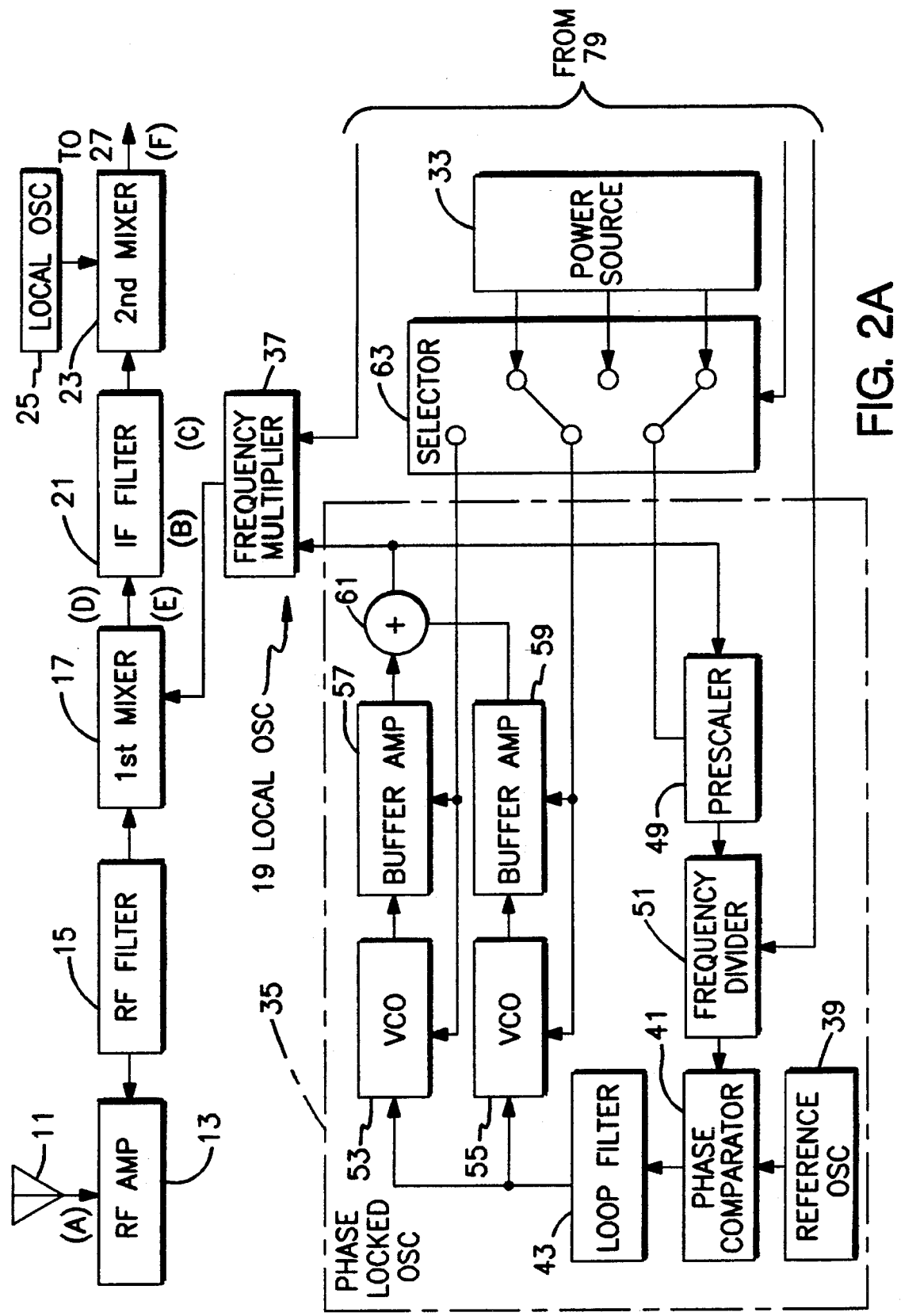
FIGS. 2A and 2B, when
Figure 2B:
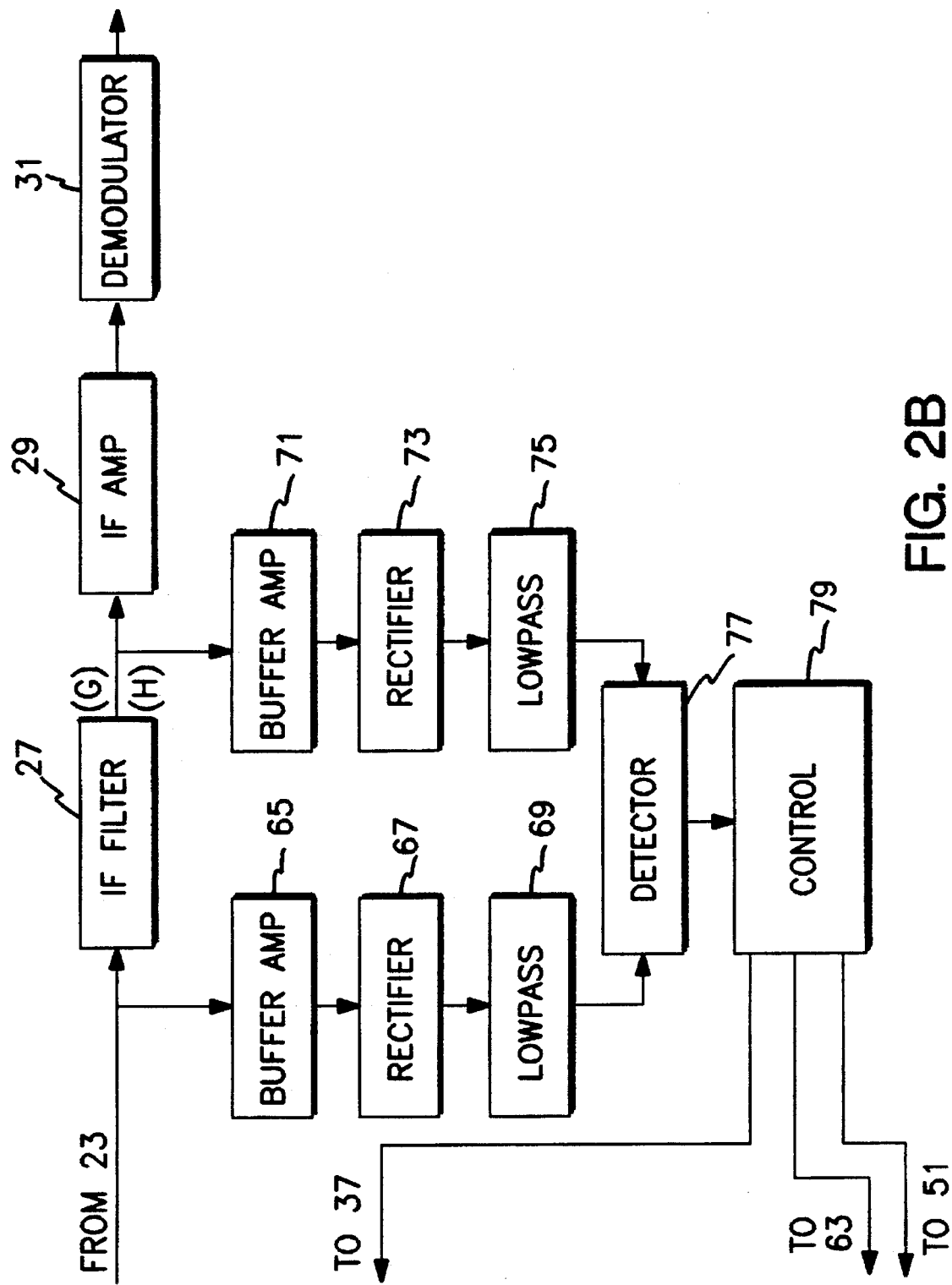
Figure 3A:
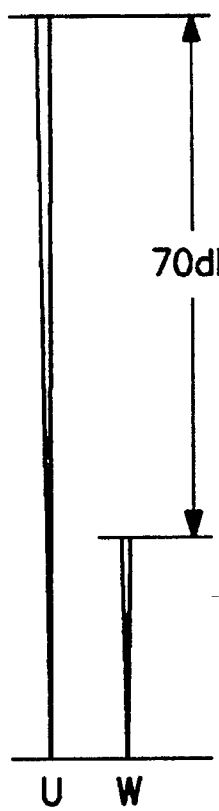
FIGS. 3A, 3B, 3C, 3D, 3E, 3F, 3G and 3H schematically show wave forms of signals at varius parts of the radio receiver illustrated in FIGS. 2A and 2B.
Figure 3B:
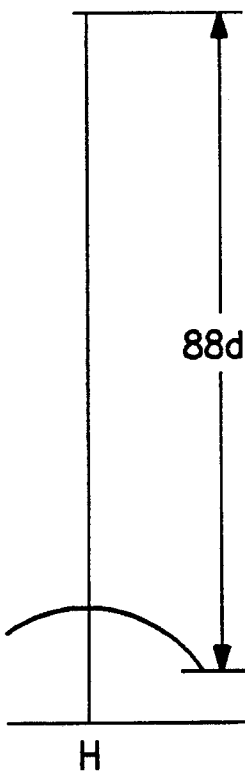
Figure 3C:
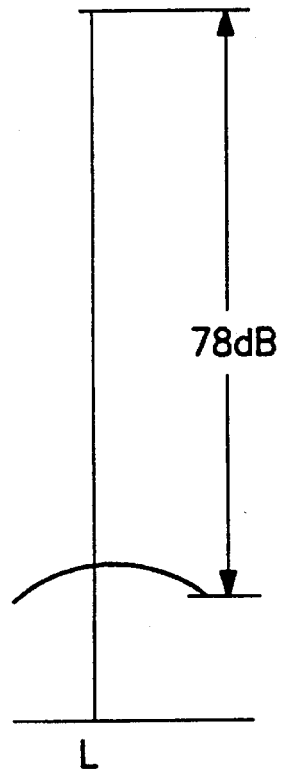
Figure 3D:
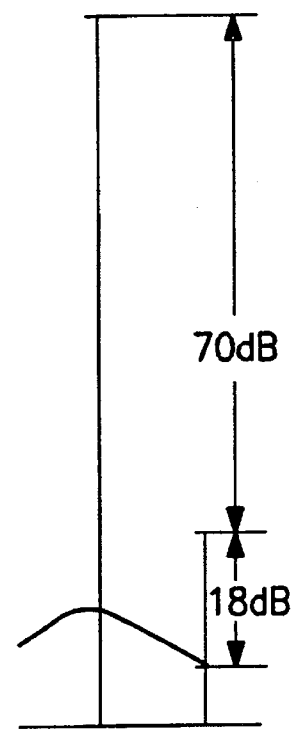
Figure 3E:
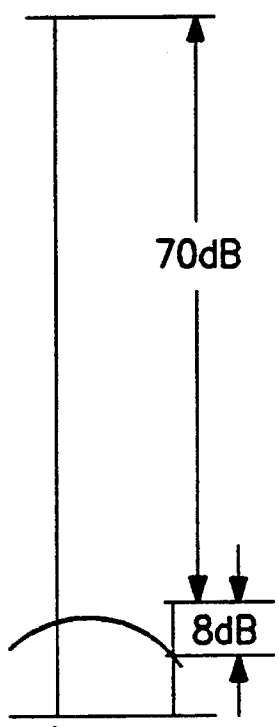
Figure 3F:
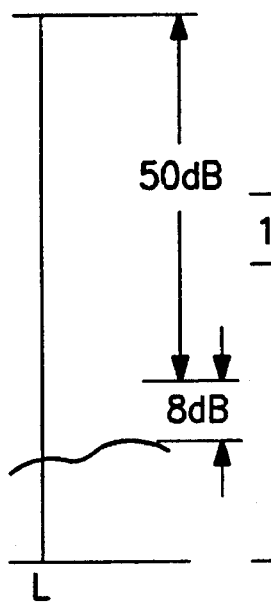
Figure 3G:
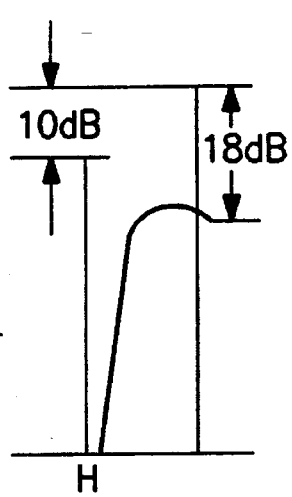
Figure 3H:
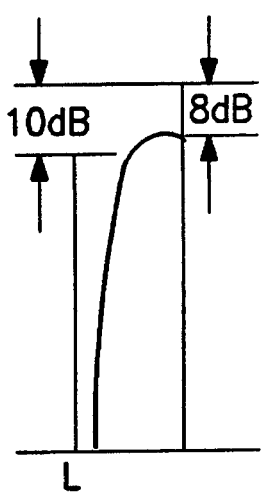

Referring to FIGS. 2(a) and 2(b), a radio receiver is according to a preferred embodiment of this invention and comprises similar parts which are designated by like reference numerals and are similarly operable with likewise named signals. In the example being illustrated, the power source 33 is connected only indirectly to the phase locked oscillator 35 merely for simplicity of illustration and will alternatively be called a voltage source.

Although denoted by like reference numerals, the phase locked oscillator is a controllable phase locked oscillator 35. The frequency multiplier is a controllable frequency multiplier 37. The prescaler is a controlled prescaler 49. The frequency divider is a controllable frequency divider 51. A combination of the controlled prescaler 49 and the controllable frequency divider 51 is called a controllable scaler (49, 51).

In the controllable phase locked oscillator 35, first and second voltage controlled oscillators 53 and 55 are used in place of the voltage controlled oscillator 45 described in conjunction with FIG. 1. Controlled through the loop filter 43 in common by the control voltage signal, the first and the second voltage controlled oscillators 53 and 55 generate first and second voltage controlled oscillation signals of a higher and a lower oscillation frequency. It will be presumed merely for clarity of the description that the higher and the lower oscillation frequencies are 260 and 65 MHz.

First and second buffer amplifiers 57 and 59 are connected to the first and the second voltage controlled oscillators 53 and 55 in one-to-one correspondence and through an adder 61 to the controllable frequency multiplier 37 and to the controlled prescaler 49. Serving as a selector 63, a switch circuit comprises three input terminals connected to the power source 33 and three output terminals connected to a first combination (53, 57) of the first voltage controlled oscillator 53 and the first buffer amplifier 57, a second combination (55, 59) of the second voltage controlled oscillator 55 and the second buffer amplifier 59, and the controlled scaler 49. As will presently be described, two switch arms are controlled usually to a position depicted by solid lines and only occasionally to a different position. It is possible to understand the selector 63 as a part of the controllable phase locked oscillator 35.

One alone of the first and the second combinations is energized at a time by the power source 33 through the selector 63. The controlled prescaler 49 is supplied, as its control voltage, ordinarily with a low voltage signal and only occasionally with a high voltage signal for operation in its highest frequency of operation.

In the manner described before, the second intermediate frequency bandpass filter 27 is supplied with the intermediate frequency signal and produces the filtered signal. The second intermediate frequency bandpass filter 27 will be referred to as intermediate frequency filter circuitry (27).

On an input side of the filter circuitry 27, an input buffer amplifier 65 picks up the intermediate frequency signal for supply to an input rectifier 67 and thence to an input lowpass filter 69, which produces a rectified intermediate frequency signal. On an output side, an output buffer amplifier 71 picks up the filtered signal for delivery to an output rectifier 73 and thence to an output lowpass filter 75, which produces a filtered and rectified signal.

Comparing the rectified intermediate frequency signal and the filtered and rectified signal, a level comparator serves as a detector 77 for detecting a level difference between the rectified intermediate frequency signal and the filtered and rectified signal to produce a level difference signal representative of the level difference, namely, a level difference between the filtered signal and the intermediate frequency signal delivered to the intermediate frequency filter circuitry 27. Responsive to the level difference signal, a control circuit 79 produces a multiplication factor control signal, a selector control signal, and a scaler control signal.

In FIG. 2, it will be surmised that the radio signal reaches the antenna 11 with a wanted frequency as a wanted signal. Attention will now be directed to a spurious signal or electromagnetic wave that may have an unwanted frequency near the wanted frequency and may reach the antenna 11 as an unwanted signal coexistent with the radio signal. This is particularly the case when the radio receiver is a selectively called mobile radio receiver and is present near a cell site with which the radio receiver is not currently interchanging communication. It is therefore likely that such a spurious signal coexists with the radio signal only occasionally.

On the other band, a carrier to noise (C/N) ratio of the radio receiver depends principally on a noise component which is undesiredly present near the generated frequency of the voltage controlled oscillator 53 or 55. In the manner described heretobefore, it is desirable in consideration of the carrier to noise ratio of the local oscillator 19 or 25 to raise the controllable frequency and to reduce the controllable factor. When the controllable frequency is raised, it has been unavoidable in prior art that power consumption grows great in the prescaler 49 and consequently in the radio receiver.

When the spurious signal coexists, its component is included in the mixed signal supplied to the first intermediate frequency bandpass filter 21 and in the intermediate frequency signal delivered to the second intermediate frequency handpass filter 27. The mixed and the intermediate frequency signals consequently have high levels. In contrast, the first intermediate frequency filter output signal and the filtered signal of the intermediate frequency filter circuitry 27 have low levels. It is therefore possible by the above-mentioned level difference to detect whether or not the spurious signal coexists with the radio signal. Incidentally, the level difference becomes great either when the higher or the lower local oscillation frequency is intentionally changed or when a frequency difference undesiredly exists between the local oscillation frequency and a nominal frequency predetermined for the intermediate frequency signal, such as between a nominal frequency of the either local oscillation frequency signal and the generated frequency into which the contrallable frequency is controlled.

In order to put the radio receiver in operation with a best possible reception sensitivity and with a least possible power consumption, the scaler control signal is supplied to the controllable frequency divider 51 to adjust the controllable frequency in the phase locked loop. Along with this control of the controllable frequency divider 51, the selector control signal and the multiplication factor control signal are delivered to the selector 63 and to the controllable frequency multiplier 37.

It will be presumed that the nominal frequency of the first local oscillation signal is 260 MHz with the higher and the lower oscillation frequencies presumed to be 260 and 65 MHz as above. Only while the spurious signal occasionally coexists, the selector 63 energizes the first combination (53, 57) alone among the first and the second combinations to raise the controllable frequency with the controllable frequency multiplier 37 controlled by the multiplication factor control signal to reduce the controllable factor to a factor of unity and to be operable merely as a buffer amplifier. Concurrently, the controlled prescaler 49 is supplied from the selector 63 with the high voltage signal to prescale the output voltage controlled oscillation signal with a greatest factor at the cost of an increase in power consumption.

So long as the spurious signal does not coexist, the selector control signal makes the selector 63 energize the second combination (55, 59) alone of the first and the second combinations with the controlled prescaler 49 supplied with the low voltage signal to keep the power consumption at a low level. Simultaneously, the controllable frequency multiplier 37 is controlled by the control circuit 79 to be operable with the controllable factor raised to a factor of four in the example being illustrated.

FIG. 3 will now be described, while continuing reference to FIGS. 2(a) and 2(b). It will be assumed that the unwanted frequency of the spurious signal has a wanted-to-unwanted frequency difference of minus 250 kHz relative to the wanted frequency of the radio signal and that the radio signal and the spurious signal reach the antenna 11 with 0 dB μV/m and 70 dB μV/m in the manner depicted at (A) in FIGS. 2(a), 2(b), and 3 with the radio and the spurious signals indicated by W and U. This ratio of 70 dB between the radio and the spurious signals does not vary through the radio frequency bandpass filter 15.

When the first combination (53, 57) is energized, the carrier to noise ratio is 88 dB at a different frequency which is different by the frequency difference from the higher oscillation frequency of 260 MHz in the manner exemplified at (B) with the higher local oscillation frequency indicated by H. When the second combination (55, 59) is energized, the carrier to noise ratio is 90 dB at a frequency different from the lower oscillation frequency of 65 MHz by the frequency difference. Being multiplied by the factor of four, the carrier to noise ratio is degraded by 12 dB. The carrier to noise ratio therefore becomes 78 dB at the different frequency different from the higher local oscillation frequency as depicted at (C) with this local oscillation frequency indicated by L in consideration of the lower oscillation frequency from which the local oscillation frequency is derived.

In the mixed signal produced by the first mixer 17, the carrier to noise ratio is kept at 88 dB at the different frequency when the higher oscillation frequency is used to provide the higher local oscillation frequency. As a consequence, the spurious signal gives rise to a noise component of minum 18 dB in the mixed signal as depicted at (D). The carrier to noise ratio is unchanged from 78 dB when the lower oscillation frequency is used. As a result, the spurious signal results in a noise component of minus 8 dB in the manner indicated at (E).

In the first intermediate frequency bandpass filter 21, the spurious signal is suppressed by 20 dB relative to the radio signal. The ratio between the radio and the spurious signals therefore becomes equal to 50 dB as illustrated at (F) in the intermediate frequency signal produced by the second mixer 23 when the lower oscillation frequency is used in providing the higher local oscillation frequency.

In the second intermediate frequency bandpass filter 27, the spurious signal is reduced by 60 dB relative to the radio signal. The ratio of the radio and the spurious signals becomes equal to 10 dB. The noise component of (D) is produced in the filtered signal without removal by the second intermediate frequency bandpass filter 27 in the manner depicted at (G) when the higher oscillation frequency is used to provide the higher local oscillation frequency. This noise component of 10 dB is transmitted eventually to the demodulator 31. The noise component of (F) is delivered to the filtered signal as indicated at (H) when the lower oscillation frequency is used in providing the higher local oscillation frequency. This noise component of 8 dB is also transmitted eventually to the demodulator 31 as it stands.

It is now appreciated that use of the lower oscillation frequency for the higher local oscillation frequency is inferior to the use of the higher oscillation frequency insofar as the power consumption is put out of consideration. This is because the noise component results in deterioration of a signal to noise (S/N) ratio of the information signal produced by the demodulator 31. In contrast, use of the higher oscillation frequency reduces the noise component by 10 dB as exemplified at (G) and (H) as compared with the use of the higher oscillation frequency. The power consumption, however, increases in this event to an objectionable extent.

When the spurious signal disappears from coexistance, the lower oscillation frequency is used in FIG. 2(a) and 2(b) to provide the higher local oscillation frequency. In this event, the controlled prescaler 49 is given the low voltage signal to reduce the power consumption.

While the invention has thus far been described in specific conjunction with sole preferred embodiment thereof, it will now be readily possible for one skilled in the art to put this invention into practice in various other manners. For example, it is possible to detect the coexistence by a level difference between the mixed signal produced by the first mixer 17 and the filter output signal of the first intermediate frequency bandpass filter 21. It is furthermore possible in the controllable phase locked oscillator 35 to use only one combination of the voltage controlled oscillator and the buffer amplifier and to control the carrier to noise ratio by varying a controllable voltage supplied to the single combination.

What is claimed is:

1. A radio signal receiving method of receiving a radio signal, comprising the steps of generating a phase locked oscillation signal of a generated frequency, frequency multiplying said phase locked oscillation signal into a local oscillation signal with said generated frequency multiplied into a local oscillation frequency with a multiplication factor, mixing said radio signal end said local oscillation signal into an intermediate frequency signal, and receiving said intermediate frequency signal to produce an information signal carried by said radio signal, wherein:

said generating step is a controllable generating step of generating said phase locked oscillation signal with a controllable frequency;

said frequency multiplying step is a controllable frequency multiplying step of multiplying said controllable frequency into said local oscillation frequency with a controllable factor used as said multiplication factor;

said receiving step comprising the steps of:

detecting, responsive to said intermediate frequency signal, whether or not a spurious signal coexists with said radio signal; and controlling said controllable generating step and said controllable frequency multiplying step to raise said controllable frequency and to reduce said controllable factor when coexistence of said spurious signal is detected.

2. A radio signal receiving method as claimed in claim 1, said local oscillation signal being a first local oscillation signal, said local oscillation frequency being a higher local oscillation frequency, said mixing step comprising a first mixing step of mixing said radio signal and said first local oscillation signal into a mixed signal and a second mixing step of mixing said mixed signal and a second local oscillation signal of a lower local oscillation frequency into said intermediate frequency signal, wherein said controllable frequency multiplying step frequency multiplies said phase locked oscillation signal into said first local oscillation signal with said controllable factor used to provide said higher local oscillation frequency.

3. A radio signal receiving method as claimed in claim 1, wherein:

said controllable generating step comprises the steps of:

generating a first voltage controlled oscillation signal of a higher oscillation frequency;

generating a second voltage controlled oscillation signal of a lower oscillation frequency;

selecting one of said first and said second voltage controlled oscillation signals as said phase locked oscillation signal to use said higher and said lower oscillation frequencies collectively as said controllable frequency;

said controlling step controlling said selecting step to make said selecting step select said first and said second voltage controlled oscillation signals as said local oscillation signal when said coexistence is and is not detected, respectively.

4. A radio signal receiving method as claimed in claim 3, wherein:

said first voltage controlled oscillation signal generating step generates said first voltage controlled oscillation signal with said local oscillation frequency given to said higher oscillation frequency;

said controllable frequency multiplying step using a factor of unity as said controllable factor to use said first voltage controlled oscillation signal as said local oscillation signal when said coexistence is detected.

5. A radio signal receiving method as claimed in claim 1, said receiving step comprising the steps of filtering said intermediate frequency signal into a filtered signal and demodulating said filtered signal into said information signal, wherein said detecting step detects said coexistence when said intermediate frequency signal and said filtered signal have a level difference.

6. A radio receiver for receiving a radio signal, comprising phase locked oscillator means for generating a phase locked oscillation signal of a generated frequency, frequency multiplier means for frequency multiplying said phase locked oscillation signal into a local oscillation signal with said generated frequency multiplied into a local oscillation frequency with a multiplication factor, mixer means for mixing said radio signal and said local oscillation signal into an intermediate frequency signal, and receiver means for receiving said intermediate frequency signal to produce an information signal carried by said radio signal, wherein:

said phase locked oscillator means is controllable phase locked oscillator means for generating said phase locked oscillation signal with a controllable frequency used as said generated frequency;

said frequency multiplier means is controllable frequency multiplier means for multiplying said controllable frequency into said local oscillation frequency with a controllable factor used as said multiplication factor;

said receiver means comprising:

detector means responsive to said intermediate frequency signal for detecting whether or not a spurious signal coexists with said radio signal; and control means for controlling said controllable phase locked oscillator means and said controllable frequency multiplier means to raise said controllable frequency and to reduce said controllable factor when coexistence of said spurious signal is detected.

7. A radio receiver as claimed in claim 6 said local oscillation signal being a first local oscillation signal, said local oscillation frequency being a higher local oscillation frequency, said mixer means comprising a first stage of mixing said radio signal and said first local oscillation signal into a mixed signal and a second stage of mixing said mixed signal and a second local oscillation signal of a lower local oscillation frequency into said intermediate frequency signal, wherein said controllable frequency multiplier means frequency multiplies said phase locked oscillation signal into said first local oscillation signal with said controllable factor used to provide said higher local oscillation frequency.

8. A radio receiver as claimed in claim 6, said controllable phase locked oscillator means comprising a phase locked loop comprising voltage generating means responsive to a frequency lowered signal for generating a control voltage signal, voltage controlled oscillator means responsive to said control voltage signal for generating an output voltage controlled oscillation signal, scaler means for scaling said output voltage controlled oscillation signal into said frequency lowered signal, and output means for producing said output voltage controlled oscillation signal as said phase locked oscillation signal, wherein:

said voltage controlled oscillator means comprises:

first voltage controlled oscillator means responsive to said control voltage signal for generating a first voltage controlled oscillation signal of a higher oscillation frequency;

second voltage controlled oscillator means responsive to said control voltage signal for generating a second voltage controlled oscillation signal of a lower oscillation frequency; and selector means for selecting one of said first and said second voltage controllevi osciliation signals as said output voltage controlled oscillation signal to use said higher and said lower oscillation frequencies collectively as said controllable frequency;

said control means controlling said selector means to make said selector means select said first and said second voltage controlled oscillation signals as said output voltage controlled oscillation signal when said coexistence is and is not detected, respectively.

9. A radio receiver as claimed in claim 8, wherein:

said first voltage controlled oscillator means generates said first voltage controlled oscillation signal with said local oscillation frequency given to said higher oscillation frequency;

said controllable frequency multiplier means using a factor of unity as said controllable factor to use said first voltage controlled oscillation signal as said local oscillation signal when said coexistence is detected.

10. A radio receiver as claimed in claim 8, further comprising voltage source means for producing high and low voltage signals, wherein:

said scaler means is controllable scaler means for scaling said output voltage controlled oscillation signal into said frequency lowered signal in response to a control voltage;

said selector means selecting said high and said low voltage signals at a time;

said control means controlling said selector means to make said selector means supply said high and said low voltage signals to said controllable scaler means as said control voltage when said coexistence is and is not detected, respectively.

11. A radio receiver as claimed in claim 8, wherein:

said scaler means is controllable scaler means for scaling said output voltage controlled oscillation signal into said frequency lowered signal with its frequency controlled in response to a scaler control signal;

said central means further controlling said controllable scaler means to control said scaler control signal in response to a frequency difference between said local oscillation frequency and an intermediate frequency predetermined for said intermediate frequency signal.

12. A radio receiver as claimed in claim 6, said receiver means comprising filter means for filtering said intermediate frequency signal into a filtered signal, wherein said detector means is for detecting a level difference between said intermediate frequency signal and said filtered signal to produce a level difference signal indicative of said coexistence when said level difference is greater than a predetermined difference.

13. A radio receiver as claimed in claim 12, said local oscillation signal being a first local oscillation signal, said local oscillation frequency being a higher local oscillation frequency, said mixer means comprising a first stage of mixing said radio signal and said first local oscillation signal into a mixed signal and a second stage of mixing said mixed signal and a second local oscillations signal of a lower local oscillation frequency into said intermediate frequency signal, said receiver means comprising filter means for filtering said intermediate frequency signal into a filtered signal and demodulator means for demodulating said filtered signal into said information signal, wherein said detector means is for detecting a level difference between said intermediate frequency signal and said filtered signal to produce a level difference signal indicative of said coexistence when said level difference is greater than a predetermined difference.

14. A radio receiver as claimed in claim 12, said local oscillation signal being a first local oscillation signal, said local oscillation frequency being a higher local oscillation frequency, said mixer means comprising a first mixing stage of mixing said radio signal and said first local oscillation signal into said intermediate frequency signal, said receiver means comprising filter means for filtering said intermediate frequency signal into a filtered signal, a second mixing stage of mixing said filtered signal and a second local oscillation signal of a lower local oscillation frequency into a mixed signal, and demodulator means for demodulating said mixed signal into said information signal, wherein said detector means is for detecting a level difference between said intermediate frequency signal and said filtered signal to produce a level difference signal indicative of said coexistence when said level difference is greater than a predetermined difference.

15. A combination of a local oscillator and intermediate frequency filter circuitry used in a radio receiver comprising phase locked oscillator means for generating a phase locked oscillation signal of a generated frequency, frequency multiplier means for frequency multiplying said phase locked oscillation signal into a local oscillation signal with said generated frequency multiplied into a local oscillation frequency with a multiplication factor to be operable as said local oscillator in cooperation with said phase locked oscillator means, and mixer means for producing an intermediate frequency signal of an intermediate frequency by mixing said local oscillation signal and a radio signal reaching said radio receiver, said intermediate frequency filter circuitry comprising an intermediate frequency bandpass filter for filtering said intermediate frequency signal into a filtered signal and demodulator means for demodulating said filtered signal into an information signal carried by said radio signal, wherein:

said phase locked oscillator means is controllable phase locked oscillator means for generating said phase locked oscillation signal with a controllable frequency used as said generated frequency;

said frequency multiplier means is controllable frequency multiplier means for multiplying said controllable frequency into said local oscillation frequency with a controllable factor used as said multiplication factor;

said intermediate frequency filter circuitry further comprising:

detector means for detecting a level difference between said intermediate frequency signal and said filtered signal to produce a level difference signal indicative of whether or not a spurious signal coexists with said radio signal; and control means for controlling said controllable phase locked oscillator means and said controllable frequency multiplier means to raise said controllable frequency and to reduce said controllable factor when coexistence of said spurious signal is detected.

16. A combination as claimed in claim 15, said local oscillation signal being a first local oscillation signal, said local oscillation frequency being a higher local oscillation frequency, said mixer means comprising a first stage of mixing said radio signal and said first local oscillation signal into a mixed signal and a second stage of mixing said mixed signal and a second local oscillation signal of a lower local oscillation frequency into said intermediate frequency signal, wherein said controllable frequency multiplier means frequency multiplies said phase locked oscillation signal into said first local oscillation signal with said controllable factor used in providing said higher local oscillation frequency.

17. A combination as claimed in claim 15, said controllable phase locked oscillator means comprising a phase locked loop comprising voltage generating means responsive to a frequency lowered signal for generating a control voltage signal, voltage controlled oscillator means responsive to said control voltage signal for generating an output voltage controlled oscillation signal, scaler means for scaling said output voltage controlled oscillation signal into said frequency lowered signals, and output means for producing said output voltage controlled oscillation signal as said phase locked oscillation signal, wherein:

said voltage controlled oscillator means comprises:

first voltage controlled oscillator means responsive to said control voltage signal for generating a first voltage controlled oscillation signal of a higher oscillation frequency;

second voltage controlled oscillator means responsive to said control voltage signal for generating a second voltage controlled oscillation signal of a lower oscillation frequency; and selector means for selecting one of said first and said second voltage controlled oscillation signals as said output voltage controlled oscillation signal to use said higher and said lower oscillation frequencies collectively as said controllable frequency;

said control means controlling said selector means to make said selector means select said first and said second voltage controlled oscillation signals as said output voltage controlled oscillation signal when said coexistence is and is not detected, respectively.

18. A combination as claimed in claim 17, wherein:

said first voltage controlled oscillator means generates said first voltage controlled oscillation signal with said local oscillation frequency used as said higher oscillation frequency;

said controllable frequency multiplier means hsing a factor of unity as said controllable factor to use said first voltage controlled oscillation signal as said local oscillation signal when said coexistence is detected.

19. A combination as claimed in claim 17, further comprising voltage source means for generating high and low voltage signals, wherein:

said scaler means is controllable scaler means for scaling said output voltage controlled oscillation signal into said frequency lowered signal in response to a control voltage;

said selector means selecting said high and said low voltage signals at a time;

said control means controlling said selector means to make said selector means supply said high and said low voltage signals to said controllable scaler means as said control voltage when said coexistence is and is not detected, respectively.

20. A combination as claimed in claim 17, said local oscillation signal being a first local oscillation signal, said local oscillation frequency being a higher local oscillation frequency, said mixer means comprising a first mixing stage of mixing said radio signal and said first local oscillation signal into said intermediate frequency signal, said intermediate frequency filter circuitry comprising said intermediate frequency bandpass filter, a second mixing stage of mixing said filtered signal and a second local oscillation signal of a lower local oscillation frequency into a mixed signal, and demodulator means for demodulating said mixed signal into said information signal.

* * * * *